(12) United States Patent
Mochida et al.

(10) Patent No.: US 12,068,021 B2
(45) Date of Patent: Aug. 20, 2024

(54) LOW POWER CLOCK INJECTION DURING IDLE MODE OPERATIONS

(71) Applicant: MICRON TECHNOLOGY, INC., Boise, ID (US)

(72) Inventors: Noriaki Mochida, Yokohama (JP); Takayuki Miyamoto, Machida (JP); Kallol Mazumder, Dallas, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 213 days.

(21) Appl. No.: 17/746,757

(22) Filed: May 17, 2022

(65) Prior Publication Data

US 2023/0206986 A1   Jun. 29, 2023

Related U.S. Application Data

(60) Provisional application No. 63/294,333, filed on Dec. 28, 2021.

(51) Int. Cl.
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
CPC .............. G11C 11/4076; G11C 11/4093
USPC ........................................ 365/233.1
See application file for complete search history.

(56) References Cited

U.S. PATENT DOCUMENTS

| 8,472,278 B2 * | 6/2013 | Haass | G06F 1/08 |
| | | | 365/233.1 |
| 2013/0315014 A1 * | 11/2013 | Dearth | G11C 7/22 |
| | | | 365/193 |

\* cited by examiner

*Primary Examiner* — Huan Hoang
(74) *Attorney, Agent, or Firm* — Dorsey & Whitney LLP

(57) ABSTRACT

An exemplary semiconductor device includes an internal clock circuit configured to intermittently enable and disable a clock signal while in a Maximum Power Savings Mode. The duty cycle of the enablement and disablement of the clock signal may be based on susceptibility to negative-bias temperature instability of a component of the semiconductor device. The clock signal may be enabled and disabled via a synchronizer.

21 Claims, 4 Drawing Sheets

LOW POWER CLOCK INJECTION DURING IDLE MODE OPERATIONS

CROSS-REFERENCE TO RELATED APPLICATION

This application claims the filing benefit of U.S. Provisional Application No. 63/294,333, filed Dec. 28, 2021. This application is incorporated by reference herein in its entirety and for all purposes.

BACKGROUND OF THE INVENTION

High data reliability, high speed of memory access, low power, and reduced chip size are features that are demanded from semiconductor memory. In some examples, semiconductor memory may occasionally operate in low-power modes to improve operational efficiency, such as power consumption. In low-power modes however, logic circuits of the semiconductor devices may receive static (e.g., idle) data signals for long periods of time. The consistent stress on the semiconductor devices, which occurs when the semiconductor devices remain in the same state for extended periods of time due to the static data signals, may increase susceptibility of the devices to reliability issues. For example, the steady-signal wear may cause additional wear due to negative-bias temperature instability (NBTI) as compared to when the devices operate in default modes. The increased susceptibility may lead to degradation of device performance. For example, switching speed of the devices may slow down due to degradation by NBTI. Further, the deterioration of device performance due to NBTI may vary between devices and circuit paths of the logic circuits, resulting in non-uniform wear of the devices and timing violations by the logic circuits. Circuit designs to limit degradation due to NBTI may improve performance of the semiconductor device

DETAILED DESCRIPTION

Figure 1:
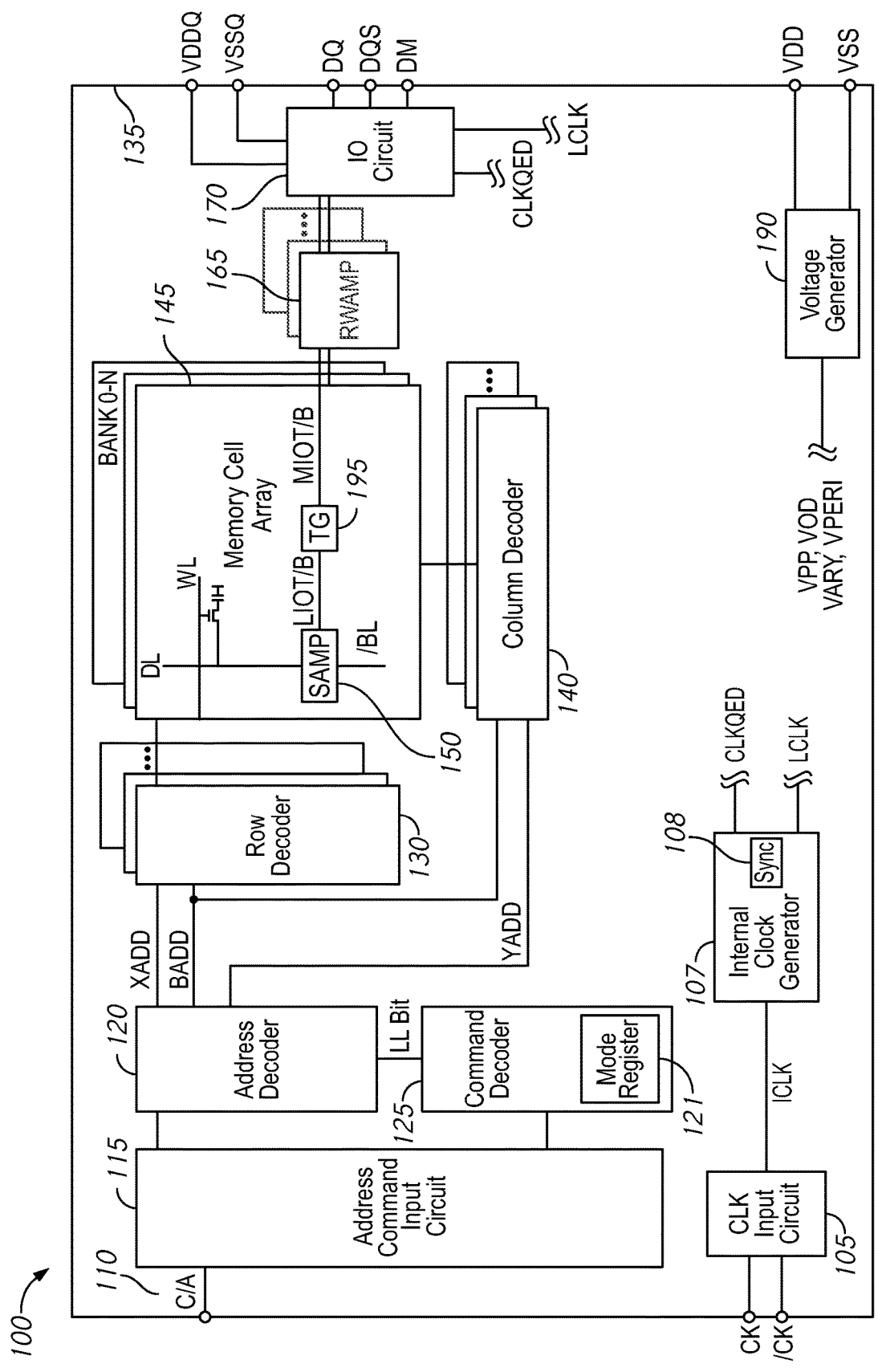
FIG. 1 is a schematic block diagram of a semiconductor device 100, in accordance with an embodiment of the present disclosure.

This disclosure describes examples of synchronization circuitry that is configured to facilitate operation of a semiconductor device in a low power or idle state or mode. For example, some memory standards specify various low power modes of operation for a memory. The low power modes may include, for example, a maximum power saving mode (MPSM) specified in the double-data-rate 5 (DDR5) standard for dynamic, random-access memory (DRAM). In some examples, while in the MPSM mode, a semiconductor device may be in a low power state while also sharing input signals with other semiconductor devices that remain in a normal mode or state of operation. In some examples, the MPSM may include various states, such as an idle state, a power-down state, and a deep power down state. While in the MPSM, the semiconductor device may ignore most commands, while providing proper on-die termination (ODT) for command, address, and data input/output (I/O) signals. The semiconductor device may enter and exit the MPSM mode via a command from a memory controller, such as a mode register write command. While in the MPSM mode, data retention is not guaranteed, as refresh operations may be stopped.

However, when in the MPSM idle mode, the static command, address, and data signals may cause circuitry (e.g., complementary metal-oxide semiconductor (CMOS) transistors and other circuitry components) of semiconductor device to remain in a same state for long periods of time. When a semiconductor circuit component remains in a same state for long periods of time, the component may begin to experience NBTI degradation or wear, which may reduce reliability of the semiconductor device as compared with a semiconductor device operating in a normal mode of operation with changing circuit component states. Conversely, constant operation of clock circuitry to toggle circuit components to prevent NBTI degradation may consume additional, unnecessary power, which may violate the MPSM power consumption limits.

This disclosure includes examples of synchronizer circuitry that is configured to periodically operate clock circuitry to toggle states of circuitry components. The synchronizer circuitry may operate a gated clock path scheme that facilitates asynchronous, abrupt starting and stopping of the clock signal without causing instability within the clock circuitry or within downstream circuitry. For example, the synchronizer circuitry may support an asynchronous non-target (NT) ODT (NT-ODT) command to start a clock signal to ensure proper ODT termination on shared command, address, and data buses. The synchronizer circuitry may enable a gated clock according to an internal oscillator cycle using a synchronizer.

The synchronizer may cause a clock signal to periodically wake up (e.g., the clock signal is intermittently enabled and disabled) for short periods of time to toggle states of circuit components while in the MPSM. The synchronizer may operate according to a prescribed on-off duty cycle, such as a 5%-on, 95%-off duty cycle. The on-off duty cycle may be set or tuned based on susceptibility of circuit components to NBTI degradation, and may be different than the example 5%-on, 95%-off duty cycle. The on-off duty cycle may be controlled using a counter incremented/decremented in response to an external clock signal, or may be controlled using an internal self-refresh (SREF) oscillator. The synchronizer may include a series of flip-flops to enable the internal clock signal. Implementation of the synchronizer for synchronous and asynchronous operation of a clock signal while in the MPSM may reduce NBTI degradation and improve reliability as compared with implementations where the circuit states remain static. In addition, implementation of the synchronizer for synchronous and asynchronous operation of a clock signal while in the MPSM may preserve power savings as compared with implementations with always-on clock circuitry.

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller at the command/address terminals via the command/address bus 110 and provide the command signal to the command decoder 125. The command decoder 125 may decode the command signal and provide various internal command signals. For example, the internal command signals may include a row command signal to select a word line, and a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, the IO circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate phase controlled internal clock signal LCLK based the ICLK signal and may generate a gated internal clock signal CLKQED in response to the ICLK, an IDLE signal from a mode register 121 of the command decoder 125, and a column select (CS) signal from the command decoder. The CLKQED signal may be generated while in a low power mode (e.g., MPSM) using a synchronizer 108. The internal clock generator 107 may provide the LCLK and the CLKQED signals to the IO circuit 170. The IO circuit 170 may use the LCLK and CLKQED signals as a timing signals for determining timing of receipt of read data and provision of write data.

In some examples, when the semiconductor device 100 operates in the low power mode, the semiconductor device may ignore most commands, while providing proper on-die termination (ODT) for command, address, and data input/output (I/O) signals received on shared command, address, and data buses. The semiconductor device may enter and exit the low power mode via a command from a memory controller, such as a mode register write command. While in the MPSM mode, data retention is not guaranteed, as refresh operations may be stopped.

However, when in the low power mode, the static command, address, and data signals may cause circuitry (e.g., complementary metal-oxide semiconductor (CMOS) transistors and other circuitry components) of the semiconductor device 100 to remain in a same state for long periods of time. When a semiconductor circuit component remains in a same state for long periods of time, the component may begin to experience NBTI degradation or wear, which may reduce reliability of the semiconductor device 100 as compared with a semiconductor device operating in a normal mode of operation with changing circuit component states.

Thus, the synchronizer 108 may be configured to periodically operate circuitry of the internal clock generator 107 toggle the CLKQED signal to toggle states of downstream circuit components. The synchronizer 108 may operate a gated clock path scheme that facilitates asynchronous, abrupt starting and stopping of the CLKQED signal without causing instability within the internal clock generator 107 or within downstream circuitry, such as the IO circuit 170. For example, the synchronizer circuitry may support an asynchronous non-target (NT) ODT (NT-ODT) command to start a clock signal to ensure proper ODT termination on shared command, address, and data buses.

Accordingly, the synchronizer 108 may cause the CLKQED clock signal to wake up (e.g., the clock signal is intermittently enabled and disabled) for short periods of time to toggle states of circuit components while in the low power mode. The synchronizer 108 may transition to the low power mode in response to the IDLE signal. The synchronizer 108 may operate to generate the CLKQED clock signal according to a prescribed on-off duty cycle, such as a 5%-on, 95%-off duty cycle. The on-off duty cycle of the CLKQED clock signal may be set or tuned based on susceptibility of circuit components to NBTI degradation and power consumption limits, and may be different than the example 5%-on, 95%-off duty cycle. In some examples, the duty cycle may be less than 50%. In other examples, the duty cycle may be less than 10%. The on-off duty cycle may be controlled using a counter incremented/decremented in response to the CK signal, or may be controlled using an internal self-refresh (SREF) oscillator. The synchronizer 108 may include a series of flip-flops to enable the internal clock signal. Implementation of the synchronizer 108 for synchronous and asynchronous operation of a clock signal while in the low power mode may reduce NBTI degradation and improve reliability as compared with implementations where the circuit states remain static. In addition, implementation of the synchronizer 108 for synchronous and asynchronous operation of a clock signal while in the low power mode may preserve power savings as compared with implementations with always-on clock circuitry.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
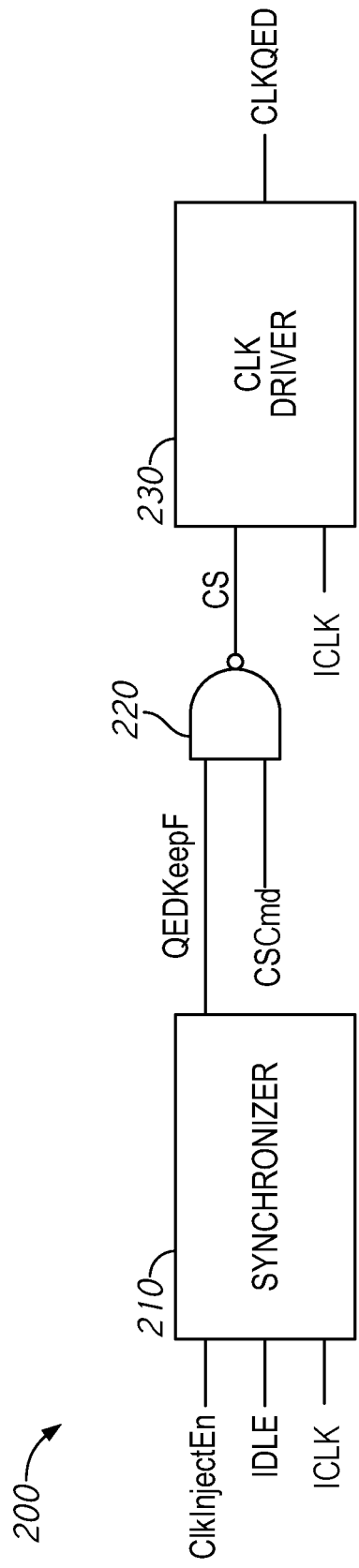
FIG. 2 is a schematic block diagram of a portion of an internal clock generator 200 of a semiconductor device, in accordance with an embodiment of the present disclosure.

FIG. 2 is a schematic block diagram of a portion of an internal clock generator 200 of a semiconductor device, in accordance with an embodiment of the present disclosure. For example, the internal clock generator 200 may include a synchronizer 210, a NAND gate 220, and a clock driver 230. The internal clock generator 107 of FIG. 1 may implement the portion of the internal clock generator 200, in some examples.

The synchronizer 210 may receive an idle signal IDLE, a clock inject enable signal ClkInjectEn, and an internal clock signal ICLK. In response to the IDLE signal, the ClkInjectEn signal, and the ICLK signal, the synchronizer 210 may be configured to provide an active-low QEDKeepF signal. The IDLE signal may be provided from a mode register setting (e.g., the mode register 121 of FIG. 1). In some examples, the mode register setting providing the IDLE signal may be based on a MPSM command to enter the MPSM. The ICLK signal may be provided based on an internal clock signal, such as the CK and /CK signals of FIG. 1. The ClkInjectEn signal may be provided from a counter or an oscillator signal.

In response to the IDLE signal, the synchronizer 210 may be configured to enter a low power mode. While in the low power mode, the synchronizer 210 may cause the QEDKeepF signal to wake up for short periods of time in response to the ClkInjectEn and ICLK signals. The ClkInjectEn signal may cause the synchronizer 210 to generate the QEDKeepF signal according to a prescribed on-off duty cycle, such as a 5%-on, 95%-off duty cycle. The on-off duty cycle of the QEDKeepF signal may be set or tuned based on susceptibility of circuit components to NBTI degradation and power consumption limits, and may be different than the example 5%-on, 95%-off duty cycle. The on-off duty cycle set by the ClkInjectEn signal may be controlled using a counter incremented/decremented in response to the ICLK signal, or may be controlled using an internal self-refresh (SREF) oscillator. The synchronizer 210 may include a series of flip-flops to enable the QEDKeepF signal. Implementation of the synchronizer 210 for synchronous and asynchronous operation of a clock signal while in the low power mode may reduce NBTI degradation and improve reliability as compared with implementations where the circuit states remain static. In addition, implementation of the synchronizer 210 for synchronous and asynchronous operation of the CLKQED signal while in the low power mode may preserve power savings as compared with implementations with always-on clock circuitry.

The NAND gate 220 may receive the QEDKeepF signal and the column select command signal CSCmd. Using NAND logic, the NAND gate 220 may be configured to enable the CS signal when either of the QEDKeepF signal or the CSCmd signals are cleared (e.g., set to a low logical value). Thus, if the CSCmd signal is set, when the QEDKeepF signal is cleared, the NAND gate 220 may be configured to set the CS signal and when the QEDKeepF signal is set, the NAND gate 220 may be configured to clear the CS signal.

The clock driver 230 may be configured to receive the CS and ICLK signal. In response to the CS signal being active, the clock driver 230 may be configured to provide a toggling CLKQED signal based on the ICLK signal. In response to the CS signal being cleared, the clock driver 230 may disable the CLKQED signal. That is, the clock driver 230 may be configured to provide the CLKQED signal. Thus, in some examples when in the low power mode (e.g., based on the IDLE signal), the clock driver 230 may only enable the CLKQED signal for short periods of time (e.g., in response to the QEDKeepF signal). Implementation of the synchronizer 210 for synchronous and asynchronous operation of a clock signal while in the low power mode (e.g., the MPSM) may reduce NBTI degradation and improve reliability as compared with implementations where the circuit states remain static. In addition, implementation of the synchronizer 210 for synchronous and asynchronous operation of a clock signal while in the low power mode may preserve power savings as compared with implementations with always-on clock circuitry.

Figure 3:
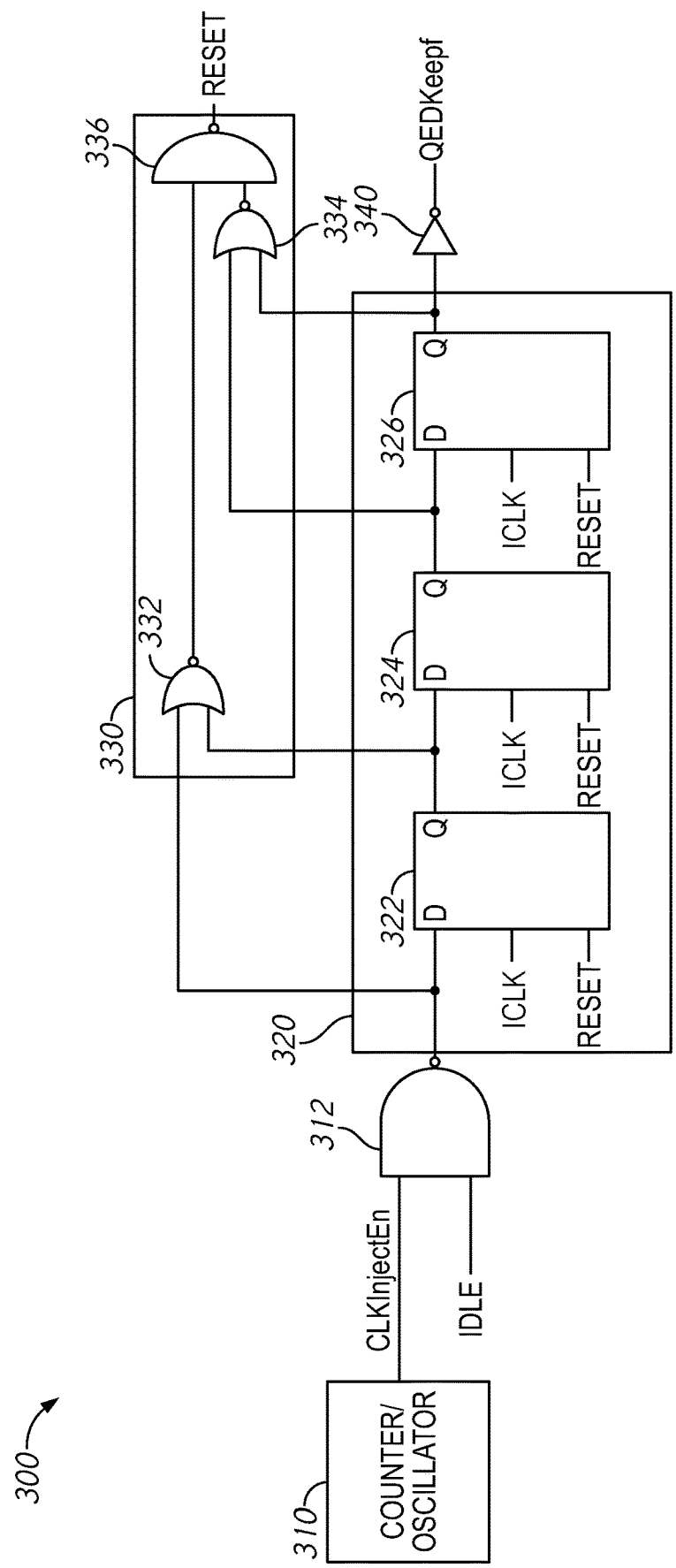
FIG. 3 is a schematic block diagram of a portion of a synchronizer 300 of a semiconductor device, in accordance with an embodiment of the present disclosure.

FIG. 3 is a schematic block diagram of a portion of a synchronizer 300 of a semiconductor device, in accordance with an embodiment of the present disclosure. For example, the synchronizer 300 may include a counter/oscillator 310, an NAND gate 312, a synchronizer circuit 320, and reset circuit 330. The internal clock generator 107 of FIG. 1 and the internal clock generator 200 of FIG. 2 may implement the portion of the internal clock generator 300, in some examples.

The counter/oscillator 310 may include a counter or oscillator that is configured to periodically set the CLKInjectEn signal according to a prescribed on-off duty cycle, such as a 5%-on, 95%-off duty cycle. The on-off duty cycle set by the counter/oscillator 310 may be set or tuned based on susceptibility of circuit components to NBTI degradation and power consumption limits, and may be different than the example 5%-on, 95%-off duty cycle. The counter/oscillator 310 may include a counter incremented/decremented in response to the ICLK signal, or may be controlled using an internal self-refresh (SREF) oscillator.

The NAND gate 312 may be configured to receive the CLKInjectEn signal and an IDLE signal. In response to the IDLE signal and the ClkInjectEn signal, the NAND gate 312 may be configured to provide an output signal to the synchronizer circuit 320 using NAND logic. The IDLE signal may be provided from a mode register setting (e.g., the mode register 121 of FIG. 1). In some examples, the mode register setting providing the IDLE signal may be based on a MPSM command to enter the MPSM.

The synchronizer circuit 320 may receive an output of the NAND gate 312, an internal clock signal ICLK, and a reset signal RESET from the reset circuit 330. The ICLK signal may be provided based on an internal clock signal, such as the CK and /CK signals of FIG. 1. In response to the output of the NAND gate 312 and the ICLK signal, the synchronizer circuit 320 may be configured to provide an active-low QEDKeepF signal.

The synchronizer circuit 320 may include serially-coupled flip-flops 322, 324, and 326. The serially-coupled flip-flops 322, 324, and 326 may propagate the output of the NAND gate 312 received at the input of the flip-flop 322 to an output of the flip-flop 326 in response to the ICLK signal. The serially-coupled flip-flops 322, 324, and 326 may be reset via the RESET signal. The QEDKeepf signal may be provided from an output of the flip-flop 326 via an inverter 340.

Figure 4:
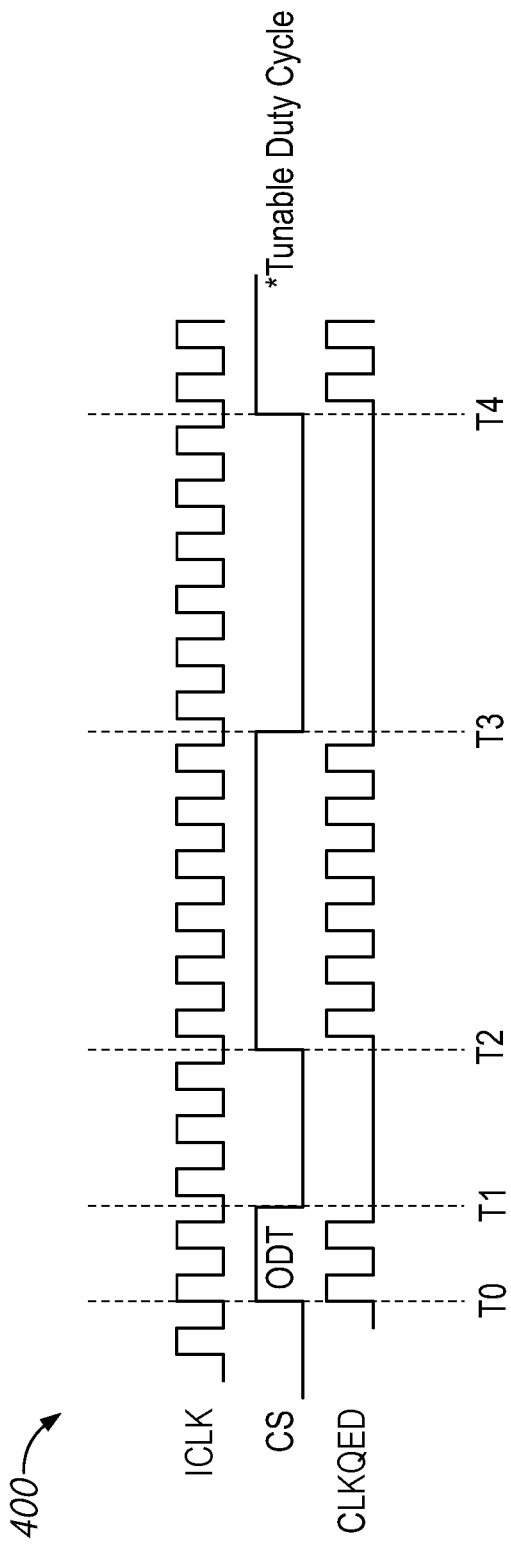
FIG. 4 is an illustration of an exemplary timing diagram 400 depicting operation of an internal clock generator while in a low power mode in accordance with embodiments of the present disclosure.

The reset circuit 330 may include a NOR gate 332, a NOR gate 334, and a NAND gate 336. The NOR gate 332 may be configured to apply NOR logic to the output of the NAND gate 312 and the output of the flip-flop 322 to provide a first input to the NAND gate 336. The NOR gate 334 may be configured to apply NOR logic to the output of the flip-flop 324 and the output of the flip-flop 326 to provide a second input to the NAND gate 336. The NAND gate 336 may be configured to apply NAND logic to the outputs of the NOR gate 332 and the NOR gate 334 to provide the RESET signal. In some examples, the RESET signal may be set when the output of the NAND gate 312 is set or the output of any of serially-coupled flip-flops 322, 324, and 326 is set. Otherwise the RESET signal may be cleared FIG. 4 is an illustration of an exemplary timing diagram 400 depicting operation of an internal clock generator while in a low power mode in accordance with embodiments of the present disclosure. In some examples, the low power mode may correspond to a MPSM. The timing diagram 400 may illustrate operation of the internal clock generator 107 of FIG. 1, the internal clock generator 200 of FIG. 2, and/or the synchronizer 300 of FIG. 3. The ICLK, CS, and CLKQED signals may correspond to the ICLK, CS, and CLKQED of FIGS. 1, 2, and/or 3, respectively.

Between times T0 and T1, the CS signal may transition to a logical high value in response to an ODT command (e.g., the output of the NAND gate 220 may transition in response to the CSCmd signal). In response to transition of the CS signal, the CLKQED signal may toggle based on the ICLK signal.

After time T1, the internal clock generator may enter a low power mode and the CS signal may transition to a logical low value. While in the low power mode, between times T1 to T2, the CS signal may remain in the logical low value. In response to the CS signal being cleared, the internal clock generator may disable the CLKQED signal.

At time T2, the CS signal may transition to the logical high value, such as in response to the QEDKeepF signal provided by the synchronizer 210 of FIG. 2 or the synchronizer 300 of FIG. 3. In response to transition of the CS signal to the logical high value, the CLKQED signal may toggle based on the ICLK signal.

At time T3, the CS signal may transition to the logical low value. In response to transition of the CS signal, the CLKQED signal may be disabled. At time T4, the CS signal may transition to the logical high value. In response to transition of the CS signal to the logical high value, the CLKQED signal may toggle based on the ICLK signal. While in the low power mode, the amount of time the CS signal is high (e.g., from time T2 to T3) versus the amount of time the CS signal is low (e.g., from time T3 to T4) may define the duty cycle of enabling and disabling the CLKQED signal. The on-off duty cycle may be set or tuned based on susceptibility of circuit components to NBTI degradation. In some examples, the duty cycle may be set to a 5%-on, 95%-off duty cycle. Other duty cycle ratios may be realized without departing from the scope of the disclosure. The on-off duty cycle may be controlled using a counter incremented/decremented in response to an external clock signal, or may be controlled using an internal self-refresh (SREF) oscillator.

The timing diagram 400 is exemplary for illustrating operation of various described embodiments. Although the timing diagram 400 depicts a particular arrangement of signal transitions of the included signals, one of skill in the art will appreciate that additional or different transitions may be included in different scenarios without departing from the scope of the disclosure. Further, the depiction of a magnitude of the signals represented in the timing diagram 400 are not intended to be to scale, and the representative timing is an illustrative example of a timing characteristics.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:
1. An apparatus comprising:
an internal clock circuit configured to receive a first clock signal, a command to enter a low power mode, and an enable signal and to provide a second clock signal, wherein, in response to the command to enter the low power mode, the internal clock circuit is configured to intermittently enable and disable the second clock signal based on a duty cycle of the enable signal.

2. The apparatus of claim 1, further comprising a mode register configured to provide the command to enter the low power mode to the internal clock circuit.

3. The apparatus of claim 2, wherein the mode register is configured to provide the command to enter the low power mode in response to receipt of an external command to enter a Maximum Power Savings Mode.

4. The apparatus of claim 1, wherein the internal clock circuit includes a synchronizer configured to provide the enable signal having the duty cycle based on a counter.

5. The apparatus of claim 4, wherein the counter is configured to cause the synchronizer to provide the enable signal having the duty cycle of less than 50 percent.

6. The apparatus of claim 4, wherein the counter is configured to cause the synchronizer to provide the enable signal having the duty cycle of less than 10 percent.

7. The apparatus of claim 4, wherein the synchronizer comprises a plurality of serially-coupled flip-flops configured to receive an output of the counter at a first one of the plurality of serially-coupled flip-flops and to propagate the output of the counter to an output of a last one of the serially-coupled flip-flops in response to the first clock signal.

8. The apparatus of claim 1, wherein the internal clock circuit further comprises a clock driver circuit configured to provide the second clock signal based on the enable signal.

9. The apparatus of claim 1, wherein, in response to receipt of a command to exit the low power mode, the internal clock circuit is configured to provide the second clock signal based on a column select command.

10. The apparatus of claim 1, further comprising an on-die termination circuit configured to control on-die termination settings based on the second clock signal.

11. A memory comprising:
an input/output circuit coupled to data terminals, wherein the data terminals are coupled to a data bus shared with another memory;
a command decoder configured to receive a Maximum Power Savings Mode (MPSM) mode register setting (MRS) command via a command bus and to provide a low power mode command in response to the MPSM MRS command;
an internal clock circuit configured to receive a first clock signal, the low power mode command, and an enable signal, wherein the internal clock circuit is configured to intermittently enable and disable provision of a second clock signal to the input/output circuit based on a duty cycle of the enable signal.

12. The memory of claim 11, further comprising a mode register configured to provide the low power mode command to the internal clock circuit in response to the MPSM MRS command.

13. The memory of claim 12, wherein the internal clock circuit includes a synchronizer configured to provide the enable signal with the duty cycle based on a counter.

14. The memory of claim 13, wherein the counter is configured to cause the synchronizer to provide the enable signal having the duty cycle of less than 10 percent.

15. The memory of claim 14, wherein the synchronizer comprises a plurality of serially-coupled flip-flops configured to receive an output of the counter at a first one of the plurality of serially-coupled flip-flops and to propagate the output of the counter to an output of a last one of the serially-coupled flip-flops in response to the first clock signal.

16. A method comprising:
receiving a mode register setting (MRS) command to enter a Maximum Power Savings Mode (MPSM) at a memory;
generating an enable signal having a duty cycle based on negative-bias temperature instability (NBTI) of a circuit component of the memory; and
in response to the MRS command to enter the MPSM, intermittently enabling and disabling a clock signal based on the duty cycle of the enable signal.

17. The method of claim 16, further comprising determining the duty cycle of the enable signal based on an output of a count value of a counter based on the NBTI of the circuit component of the memory.

18. The method of claim 16, further comprising setting the duty cycle of the enable signal to less than 10 percent.

19. The method of claim 16, further comprising propagating the enable signal through a plurality of serially-coupled flip-flops.

20. The method of claim 16, further comprising driving the clock signal via a clock driver.

21. The method of claim 16, wherein:
the MRS command to enter the MPSM is a first MRS command to enter the MPSM;
the clock signal is a first clock signal; and
the method further comprises, in response to receipt of a second MRS command to exit the MPSM, providing a second clock signal based on a column select command.

* * * * *